United States Patent
Lu et al.

(10) Patent No.: US 9,042,090 B2
(45) Date of Patent: May 26, 2015

(54) MOUNTING APPARATUS FOR DISPLAY DEVICE

(71) Applicant: HON HAI PRECISION INDUSTRY CO., LTD., New Taipei (TW)

(72) Inventors: Hung-Chun Lu, New Taipei (TW); Su-Sheng Weng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 119 days.

(21) Appl. No.: 13/951,377

(22) Filed: Jul. 25, 2013

(65) Prior Publication Data
US 2015/0009647 A1 Jan. 8, 2015

(30) Foreign Application Priority Data
Jul. 5, 2013 (TW) .............................. 102124149 A

(51) Int. Cl.
*H05K 7/16* (2006.01)
*H05K 5/00* (2006.01)
*G06F 1/16* (2006.01)
*H05K 7/18* (2006.01)

(52) U.S. Cl.
CPC ............... *H05K 7/16* (2013.01); *H05K 5/0017* (2013.01); *G06F 1/1601* (2013.01); *H05K 7/18* (2013.01)

(58) Field of Classification Search
CPC ....... G06F 1/16; G06F 1/1607; G06F 1/1601; G06F 7/00; H05K 5/0004; H05K 5/0017; H05K 5/0243; H05K 7/18; H05K 1/028; H05K 7/1481; H05K 7/1487; H05K 7/16

USPC ............ 361/679.01, 679.02, 679.09, 679.26, 361/679.21, 679.22, 679.27, 679.04, 361/679.05, 679.06, 679.07, 679.4, 361/724–727; 248/917–924; 312/223.1–223.2; 211/26

See application file for complete search history.

(56) References Cited

U.S. PATENT DOCUMENTS 8,456,844 B2 * 6/2013 Chou et al. .................... 361/727
2013/0279090 A1 * 10/2013 Brandt ..................... 361/679.01

* cited by examiner

*Primary Examiner* — Anthony Haughton
*Assistant Examiner* — Ingrid Wright
(74) *Attorney, Agent, or Firm* — Novak Druce Connolly Bove + Quigg LLP

(57) ABSTRACT

A mounting apparatus includes a supporting board, a first adjusting member including a rotating board and a fixing plate, a second adjusting member to install a display device. The rotating board includes a tab, is mounted on the supporting board, and is rotatable about an axis perpendicular to the supporting board. The second adjusting member is mounted to the fixing plate and is rotatable about an axis perpendicular to the fixing plate. A first sliding block is slidably mounted to the supporting board. A second sliding block is slidably mounted to the rotating plate. The first and second sliding blocks each define a slanted groove. A pin protrudes from each of the tab and the second adjusting member to be slidably received in the slanted grooves. The first sliding block is slid to rotate the first adjusting member, the second sliding blocks is slid to rotate the second adjusting members.

14 Claims, 11 Drawing Sheets

MOUNTING APPARATUS FOR DISPLAY DEVICE

BACKGROUND

1. Technical Field

The present disclosure relates to a mounting apparatus for mounting a display device.

2. Description of Related Art

Television displays are often fixed to walls or racks. When users want to adjust a position or an angle of a television display, the television display needs to be disengaged and reinstalled, which is time consuming, tedious, and may cause accidents.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
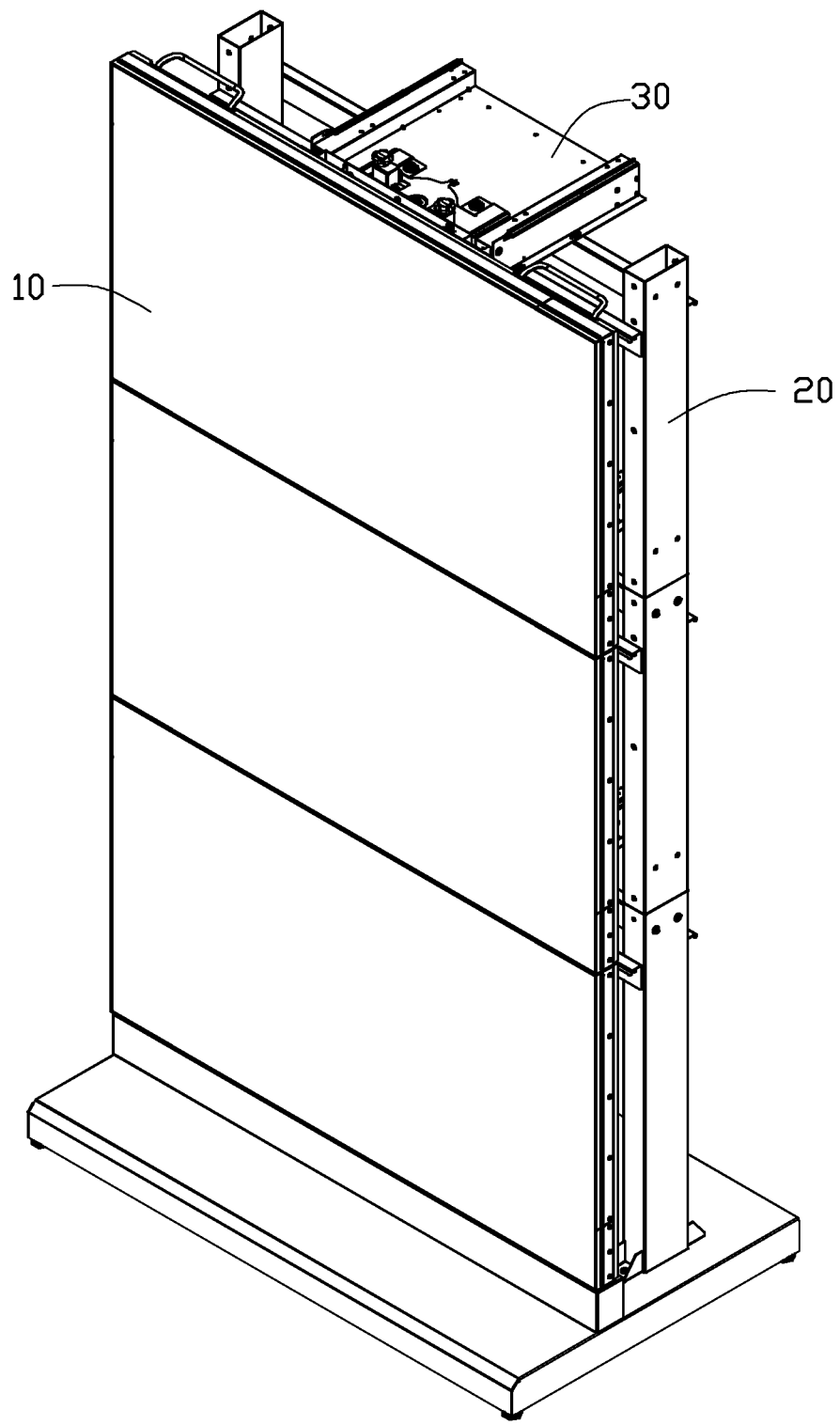
FIG. 1 is an assembled, isometric view of an embodiment of a mounting apparatus, together with a plurality of display devices, wherein the mounting apparatus includes an adjusting assembly.
Figure 2:
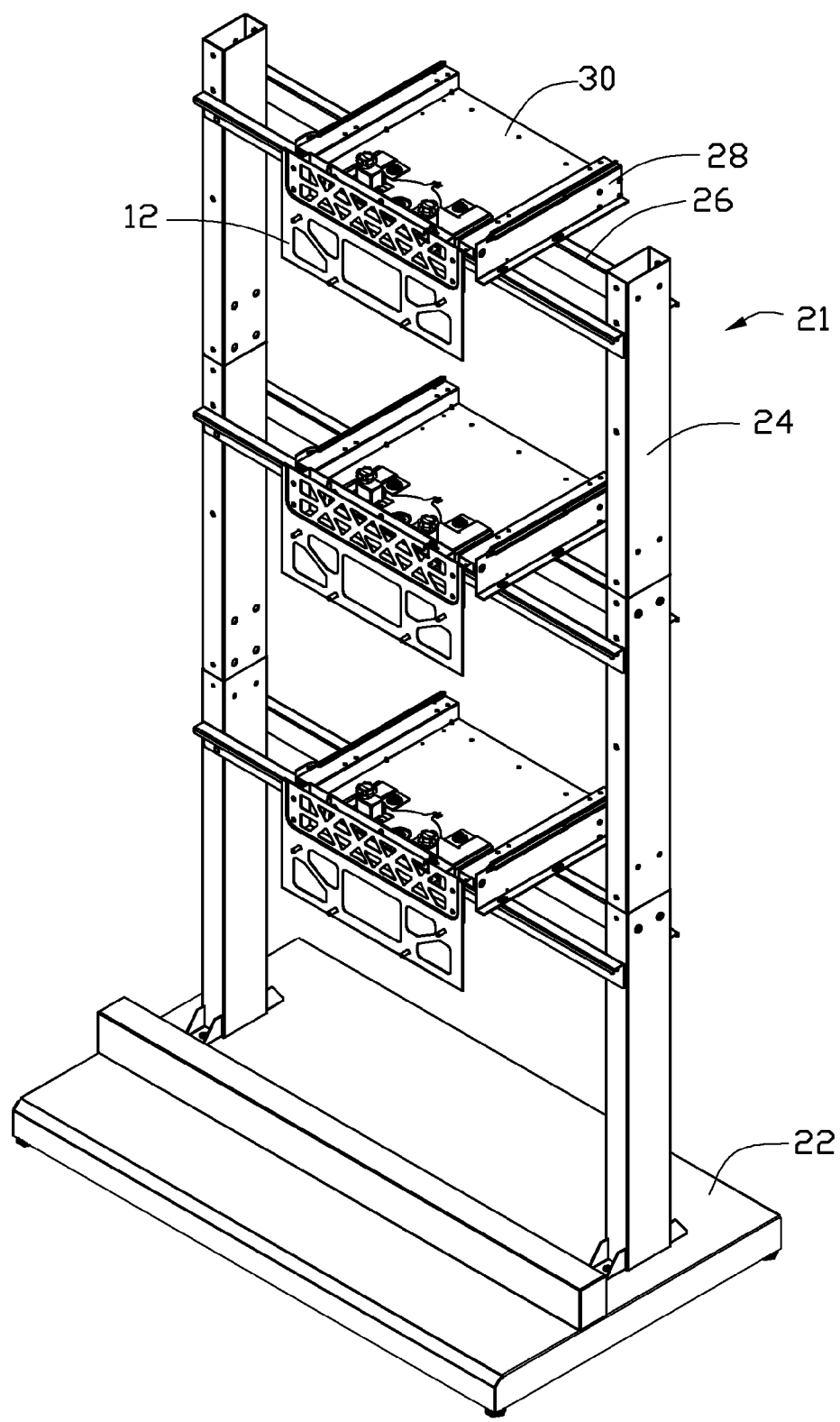
FIG. 2 is an assembled, isometric view of the mounting apparatus of FIG. 1.
Figure 3:
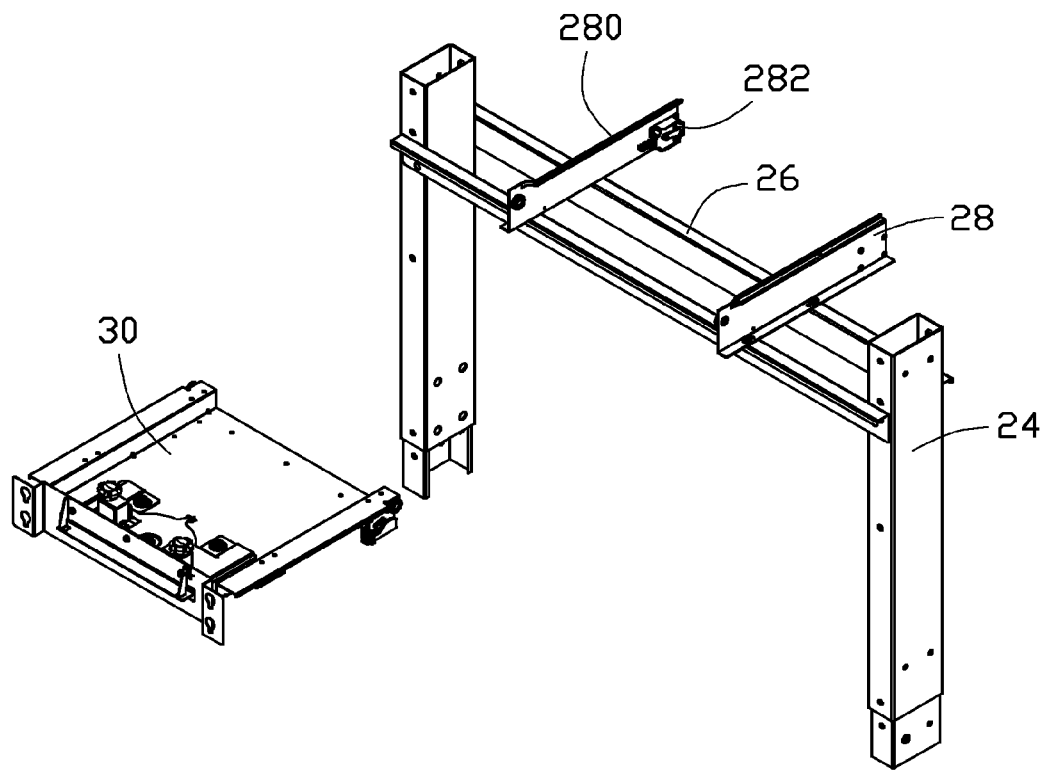
FIGS. 3 and 4 are partly assembled views of FIG. 2.
Figure 4:
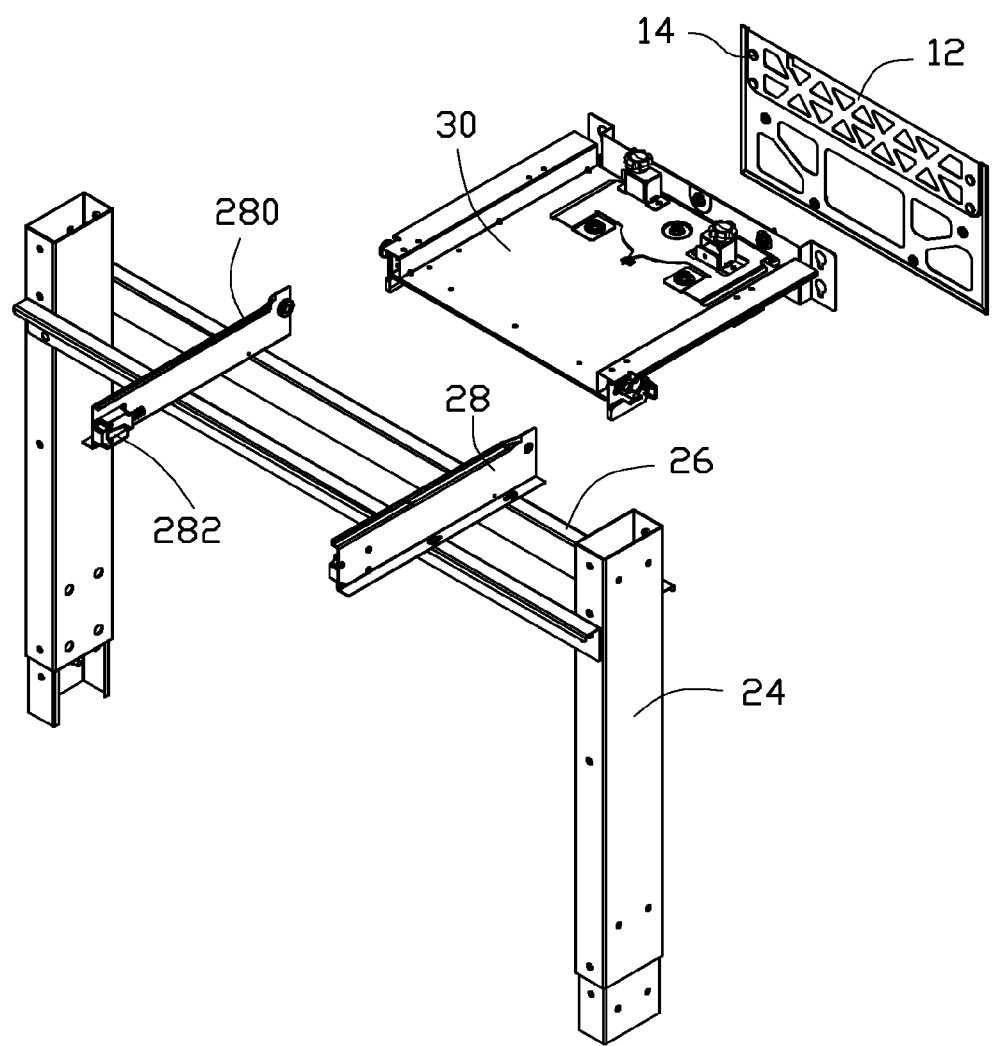

The disclosure, including the accompanying drawings, is illustrated by way of example and not by way of limitation. It should be noted that references to "an" or "one" embodiment in this disclosure are not necessarily to the same embodiment, and such references mean at least one.

FIGS. 1 to 4 show embodiments of a mounting apparatus. The mounting apparatus is provided for installing a plurality of display devices 10. The mounting apparatus includes a rack 20 and a plurality of adjusting assemblies 30.

In the embodiment, the display devices 10 are television displays. An installing board 12 is mounted to a rear side of each display device 10. Two fasteners 14 are mounted to opposite ends of each installing board 12.

The rack 20 includes a base 22 and a plurality of frames 21 mounted on the base 22. Each frame 21 includes two hollow poles 24, two connecting arms 26 perpendicularly connected between front sides and rear sides of the poles 24, and two holding arms 28 perpendicularly connected between the connecting arms 26. Two covering arms 280 extend from top sides of the holding arms 28 and toward each other. A first locking member 282 is mounted to a rear end of an inner surface of each holding arm 28 and toward the other holding arm 28. A size of a bottom end of each pole 24 is less than a top end of the pole 24 in cross-section; thereby the bottom end of the pole 24 can be inserted into the top end of the corresponding pole 24 of a lower frame 21.

Figure 5:
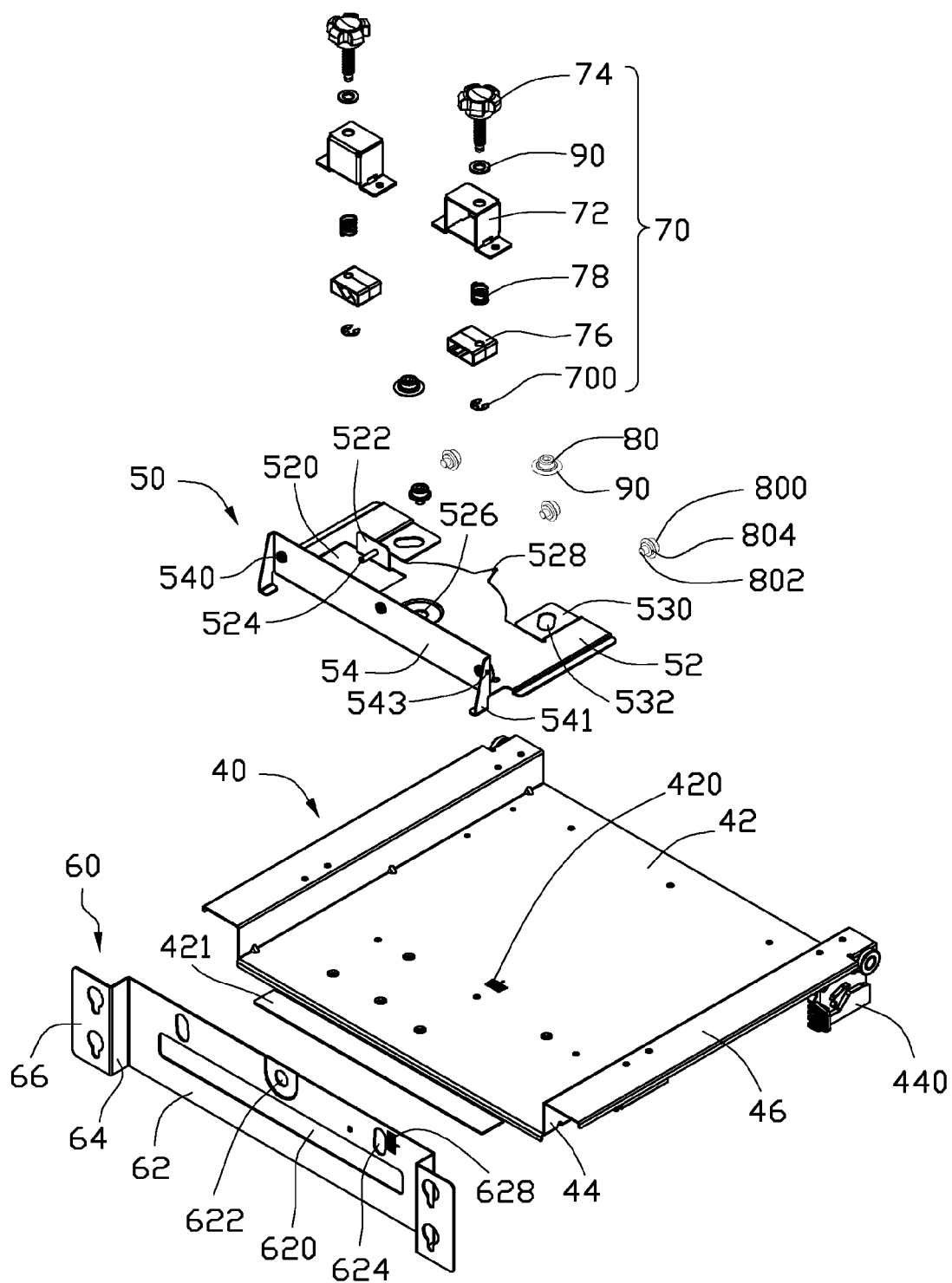
FIG. 5 is an exploded view of the adjusting assembly of FIG. 2.
Figure 6:
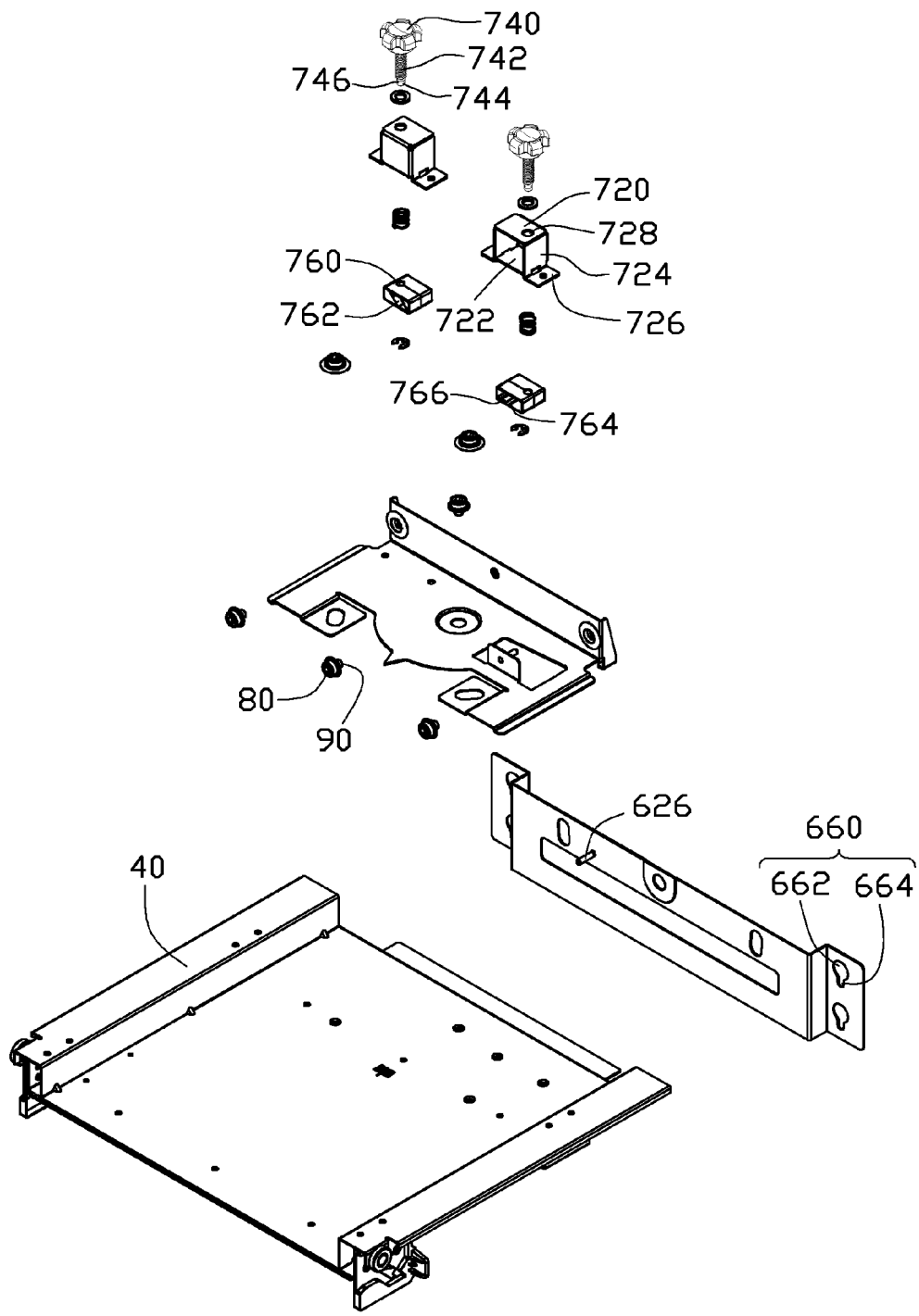
FIG. 6 is similar to FIG. 5, but viewed from another perspective.

FIGS. 5 and 6 show that each adjusting assembly 30 is mounted on one of the frames 21. The adjusting assembly 30 includes a supporting member 40, a first adjusting member 50, a second adjusting member 60, two driving members 70, and a plurality of fixing members 80.

The supporting member 40 includes a supporting board 42 rested on the connecting arms 26, two side plates 44 perpendicularly extending up from opposite sides of the supporting board 42 and slidable along the holding arms 28, and two extension plates 46 perpendicularly extending out from top sides of the side plates 44 and slidably contacting bottoms of the covering arms 280. An arc-shaped first angle square 420 is marked on the supporting board 42. A second locking member 440 is mounted on an outer surface of each side plate 44, to latch with a corresponding one of the first locking member 282. A supporting piece 421 extends out from a front end of the supporting board 42.

The first adjusting member 50 includes a rotating board 52 and a rectangular fixing plate 54 perpendicularly extending up from a front side of the rotating board 52. The rotating board 52 defines an opening 520 in a right side and a through hole 526 in a center. A tab 522 perpendicularly extending up from a rear side bounding the opening 520. A first pin 524 perpendicularly extends toward the fixing plate 54 from a front side of the tab 522. An arrow pointer 528 extends rearward from a center of a rear side of the rotating board 52. The rotating board 52 includes two mounting pieces 530 at opposite ends of the rear side. Each mounting piece 530 defines a slide slot 532 slantingly extending rearward and toward the pointer 528. The fixing plate 54 defines three fixing holes 540 along a lengthwise direction of the fixing plate 54. Two extension pieces 541 perpendicularly extend forward from opposite ends of the fixing plate 54. A pointer 543 is marked on an outer surface of the left extension piece 541.

The second adjusting member 60 includes a main plate 62, two connecting plates 64 perpendicularly extending forward from opposite ends of the main plate 62, and two holding plates 66 perpendicularly extending out from front sides of the connecting plates 64.

The main plate 62 defines a receiving slot 620 along the lengthwise direction, a through hole 622 above the receiving slot 620, and two slide slots 624 above the receiving slot 620 and at opposite sides of the through hole 622. The slide slots 620 extend along the widthwise direction of the main plate 62. A second pin 626 between the through hole 622 and the left slide slot 624 perpendicularly extends rearward from a rear side of the main plate 62. A second angle square 628 is marked on a front side of the main plate 62 and adjacent to the left slide slot 624.

Each holding plate 66 defines an installing hole 660 including a first hole 662 and a second hole 664 below and communicating with the first hole 662. The first hole 662 is greater than the second hole 664 in width.

Each driving member 70 includes a housing 72, a bolt 74, a sliding block 76, a spring 78, a washer 90, and a C-shaped latching member 700.

The housing 72 includes a top wall 720, a bottom wall 722, two sidewalls 724 perpendicularly connected between the top and bottom walls 720 and 722, and two legs 726 perpendicularly extend out from bottom ends of the sidewalls 724. The top wall 720 and the bottom wall 722 define two through holes 728 aligning with each other.

The bolt 74 includes a head 740, a rod 744, and a threaded portion 742 connected between the head 740 and the rod 744. The rod 744 defines an annular groove 746 in a circumference.

The sliding block 76 defines a threaded hole 760 extending through a top surface and a bottom surface of the sliding block 76, and a slanted groove 762 extending through one of opposite sides of the siding block 76. A lower end of the slanted groove 762 slantingly extends downward and toward the threaded hole 760, and the slanted groove 762 includes a first slanted surface 764 adjacent to the threaded hole 760 and a second slanted surface 766 away from the threaded hole 760 (shown in FIG. 8).

The spring 78 and the sliding block 76 are received between the top and bottom walls 720 and 722. The bolt 74 extends through the washer 90, the through hole 728 of the top wall 720, the spring 78, the threaded hole 760, and the through hole 728 of the bottom wall 722, to allow the annular groove 746 to be exposed out of a bottom surface of the bottom wall 722. The latching member 700 is engaged in the annular groove 746. The spring 78 is deformed.

Each fixing member 80 includes a head 800, a fixing portion 802, and a rod 804 connected between the head 800 and the fixing portion 802.

Figure 7:
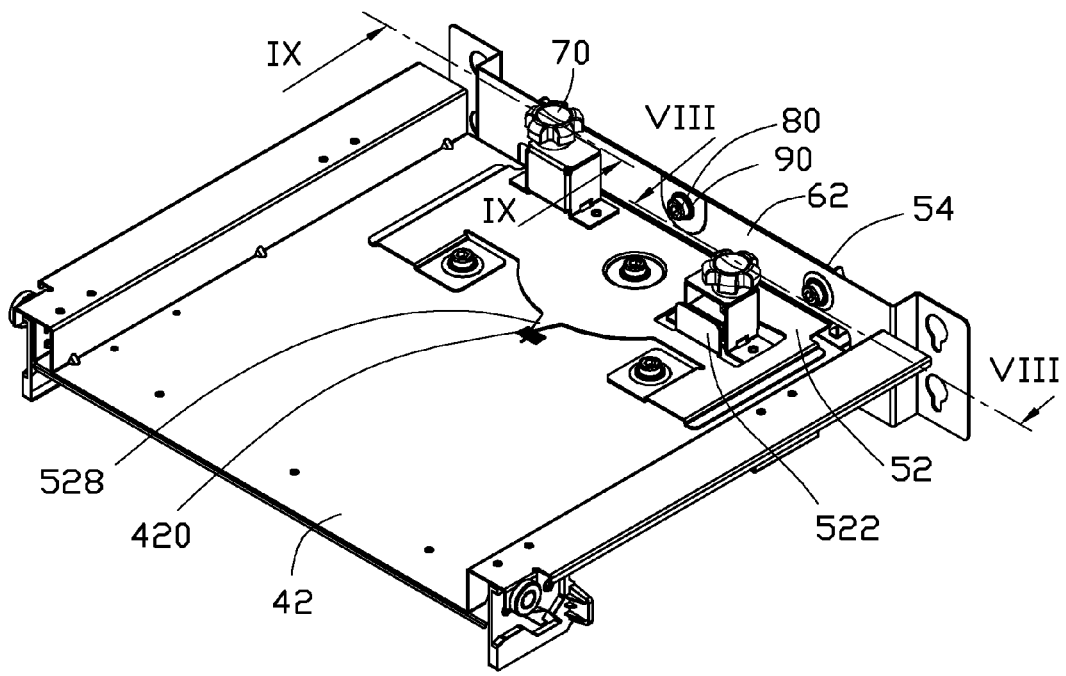
FIG. 7 is an assembled view of FIG. 6.
Figure 8:
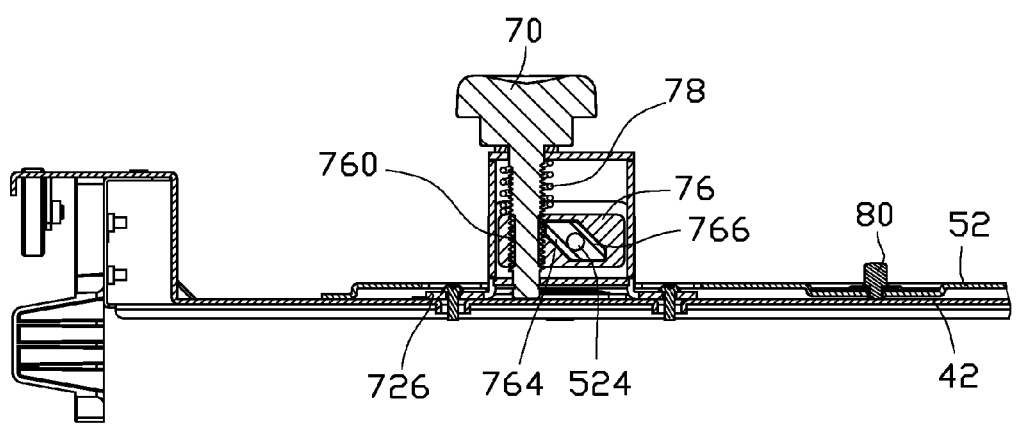
FIG. 8 is a cross-sectional view of FIG. 7, taken along the line VIII-VIII.
Figure 9:
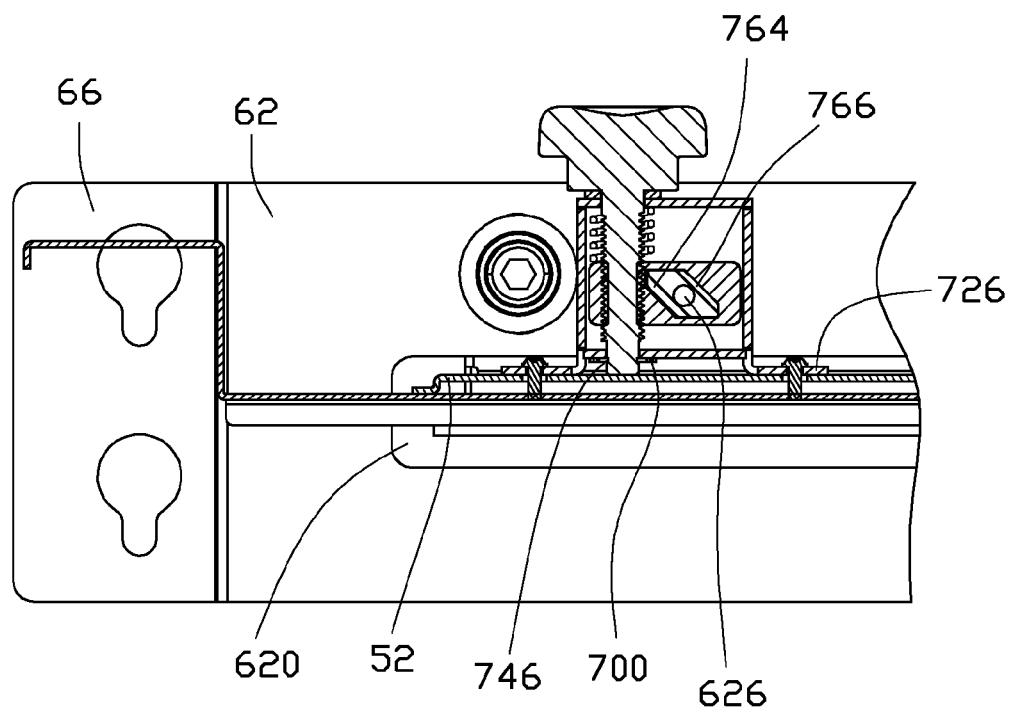
FIG. 9 is a cross-sectional view of FIG. 7, taken along the line IX-IX.

FIGS. 7 to 9 show that in assembly, the supporting piece 421 extends through the receiving slot 620 from the rear side of the main plate 62. The rotating board 52 extends through the receiving slot 620 from the front side of the main plate 62, until the fixing plate 54 contacts the front side of the main plate 62. Bottom ends of the extension pieces 541 are supported on a top of the supporting piece 421. The pointer 543 points to the second angle square 628. The fixing portion 802 of one of the fixing members 80 extends through a washer 90 and rotatably extends through the through hole 622, and then is engaged in the middle fixing hole 540. Another two fixing members 80 extend through two washers 90 and slidably extend through the slide slots 624, and then are engaged in the other two fixing holes 540. Therefore, the second adjusting member 60 is rotatably mounted to the first adjusting member 50 about the middle fixing member 80 which is a first axis perpendicular to the fixing plate 54. The main plate 62 is spaced from the rotating board 52. The second pin 626 is away from the opening 520. The legs 726 of one of the driving members 70 is mounted on a left side of the rotating board 52, to allow the second pin 626 to be slidably received in the corresponding slanting groove 762.

A fixing member 80 extends through a washer 90 and rotatably extends through the through hole 526, and then is engaged in the supporting board 42. Two fixing members 80 extend through two washers 90 and the slide slots 532, and then are engaged in the supporting board 42. Therefore, the first adjusting member 50 is rotatably mounted on the supporting board 42 about the fixing member 80 fixed in the through hole 526 which is a second axis perpendicular to the supporting board 42. The pointer 528 points to the first angle square 420. The first pin 524 is slidably received in the slanting groove 762 of the other driving member 70. The legs 726 of the other driving member 70 extend through the opening 520 and then are fixed to the supporting board 42.

The slanted grooves 762 slantingly extend upward and away from each other. In this embodiment, an upper end of the slanted groove 762 of the right driving member 70 slantingly extends upward and rightward, an upper end of the slanted groove 764 of the left driving member 70 slantingly extends upward and leftward. When the driving members 70 are mounted at a same side of the through hole 526, the slanted grooves 762 can be slantingly extended in a same direction.

The fasteners 14 extend through the first holes 662 and then are engaged in the second holes 664. Therefore, the display device 10 is mounted to a front side of the second adjusting member 60.

Figure 10:
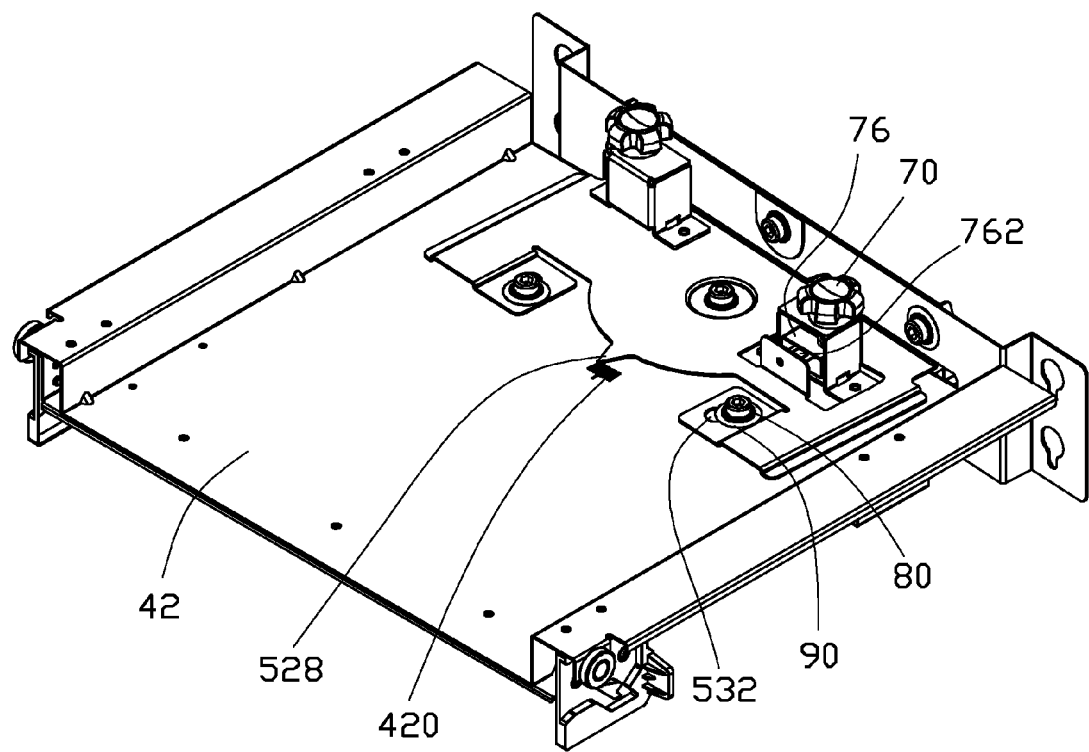
FIGS. 10 and 11 are similar to FIG. 7, but showing different using states of the mounting apparatus.

FIG. 10 shows that to rotate the display device 10 about the second axis, to allow a right end of the display device 10 to move rearward, while a left end of the display device 10 moves forward, the head 740 of the driving member 70 mounted to the supporting board 42 is rotated. The sliding block 76 is moved downward, the second slanted surface 766 pushes the first pin 524 rightward, to drive the rotating board 52 to rotate about the fixing member 80 fixed in the through holes 526 clockwise, until the fixing member 80 mounted in the left slide slot 532 abuts against a rear end of the left slide slot 532, while the fixing member 80 mounted in the right slide slot 532 abuts against a front end of the right slide slot 532.

In case to make the right end of the display device 10 to move forward, while the left end of the display device 10 moves rearward, the head 740 of the driving member 70 mounted to the supporting board 42 is rotated. The sliding block 76 is moved upward, the first slanted surface 764 pushes the first pin 524 leftward, to drive the rotating board 52 to rotate about the through holes 526 anti-clockwise, until the fixing member 80 mounted in the left slide slot 532 abuts against a front end of the left slide slot 532, while the fixing member 80 mounted in the right slide slot 532 abuts against a rear end of the right slide slot 532.

The pointer 628 is capable of moving along the first angle square 420, to indicate an angle of an end of the display device 10 has been moved.

Figure 11:
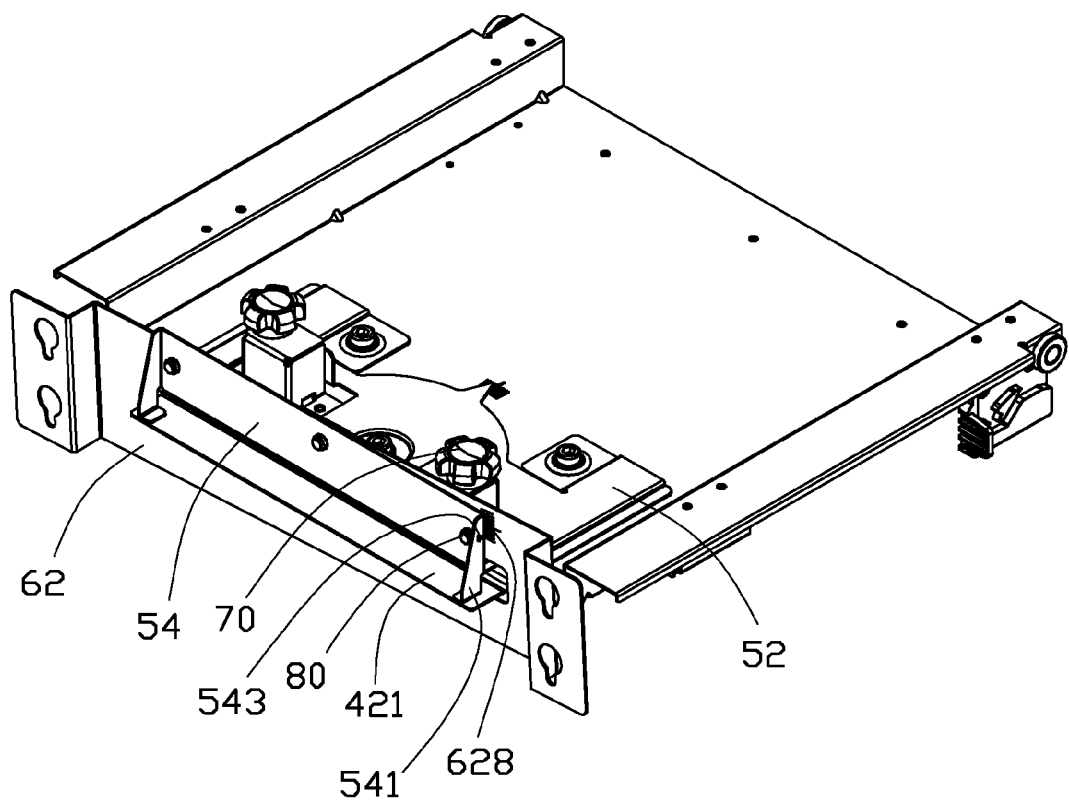

FIG. 11 shows that to rotate the display device 10 about the first axis, to allow the right end of the display device 10 to move upward, while the left end of the display device 10 moves downward, the head 740 of the driving member 70 mounted to the rotating board 52 is rotated. The sliding block 76 is moved down, the second slanted surface 766 pushes the first pin 524 downward, to drive the second adjusting member 60 to rotate about the fixing member 80 fixed in the through holes 622, until the fixing member 80 mounted in the left slide slot 624 abuts against a top end of the left slide slot 624, while the fixing member 80 mounted in the right slide slot 624 abuts against a bottom end of the right slide slot 624.

The head 740 of the driving member 70 mounted to the rotating board 52 can be rotated to allow the sliding block 76 to move upward, and the first slanted surface 764 will push the first pin 524 upward. Thereby, the right end of the display device 10 moves downward, while the left end of the display device 10 moves upward. At this time, the fixing member 80 mounted in the left slide slot 624 abuts against a bottom end of the left slide slot 624, while the fixing member 80 mounted in the right slide slot 624 abuts against a top end of the right slide slot 624.

The pointer 543 is capable of moving along the second angle square 628, to indicator an angle of an end of the display device 10 has been moved.

Because the supporting member 40 is slidably mounted to the rack 20, the display device 10 is capable of being slid forward or rearward.

It is believed that the present embodiments and their advantages will be understood from the foregoing description, and various changes may be made thereto without departing from the spirit and scope of the description or sacrificing all of their

What is claimed is:

1. A mounting apparatus for mounting a display device, the mounting apparatus comprising:
   a rack; and
   an adjusting assembly comprising:
      a supporting member mounted to the rack and comprising a supporting board;
      a first adjusting member comprising a rotating board and a fixing plate perpendicularly extending up from a front end of the rotating board; the rotating board defining an opening and forming a tab, a first pin perpendicularly extending forward from the tab; the rotating board is rotatably mounted to the supporting board about a first axis perpendicular to the supporting board;
      a second adjusting member to which the display device is mounted; the second adjusting member is rotatably mounted to the fixing plate about a second axis perpendicular to the fixing plate, a second pin perpendicularly extending rearward from the second adjusting member;
      a first driving member extending through the opening and mounted to the supporting board, the first driving member comprising a first sliding block slidable along a direction perpendicular to the supporting board; the first sliding block defining a first slanted groove in which the first pin is slidably received, wherein the first sliding block slides to allow the rotating board to be rotated; and
      a second driving member mounted to the rotating board and comprising a second sliding block slidable along the direction perpendicular to the supporting board, the second sliding block defining a second slanted groove in which the second pin is slidably received; wherein the second siding block slides to allow the second adjusting member to be rotated.

2. The mounting apparatus of claim 1, wherein upper ends of the first and second slanted grooves slantingly extend upward and away from each other.

3. The mounting apparatus of claim 1, wherein the rotating board defines a through hole in a center, a fixing member rotatably extends through the through hole and then is engaged in the supporting board.

4. The mounting apparatus of claim 1, wherein an angle square is formed on the supporting board, a pointer extends from a center of a rear end of the rotating board and points to the angle square.

5. The mounting apparatus of claim 1, wherein the rotating board defines two slide slots in rear ends of opposite sides of the rotating board, the slide slots extend rearward and toward each other, two fixing members slidably extend through the slide slots and then are engaged in the supporting board.

6. The mounting apparatus of claim 1, wherein the second driving member has a same form as the first driving member, the first driving member further comprises a housing mounted to the supporting board and receiving the first sliding block, and a spring received in the housing, the housing of the second driving member is mounted to the rotating board.

7. The mounting apparatus of claim 6, wherein the first driving member and the second driving member each further comprise a bolt and a latching member, the first and second sliding blocks each define a threaded hole, each housing comprises a top wall and a bottom wall each defining a second through hole, each bolt comprises a threaded portion, and a head and a rod connected to opposite ends of the threaded portion, each rod extends through the through hole of the corresponding top wall, the corresponding threaded hole and the through hole of the corresponding bottom wall, the latching members latch with the rods under the corresponding bottom walls.

8. The mounting apparatus of claim 1, wherein the second adjusting member comprises a main plate defining a through hole, a fixing member rotatably extends through the through hole to be engaged in the fixing plate.

9. The mounting apparatus of claim 8, wherein the main plate defines two slide slots perpendicular to the rotating board and at opposite sides of the through hole, two fixing members slidably extend through the slide slots to be engaged in the fixing plate.

10. The mounting apparatus of claim 9, wherein the main plate forms an angle square adjacent to one of the slide slots, the fixing plate forms a pointer pointing to the angle square.

11. The mounting apparatus of claim 8, further comprising an installing board mounted to a rear side of the display device, wherein two fasteners extend from the installing board, the adjusting member comprises two holding plates, each holding plate defines a first hole and a second hole below and communicating with the first hole, the first hole is greater than the second hole in width, the fasteners extend through the first holes and then are engaged in the second holes.

12. The mounting apparatus of claim 1, wherein the supporting member is slidably mounted to the rack.

13. The mounting apparatus of claim 12, wherein the rack comprises a base and a frame, the frame comprise two poles perpendicularly mounted to the base, two connecting arms perpendicularly connected between the poles, and two holding arms perpendicularly connected between the connecting arms, the supporting member is slidably received between the holding arms.

14. The mounting apparatus of claim 13, wherein two covering arms perpendicularly extend toward each other from top ends of the holding arms, two side plates perpendicularly extend up from opposite sides of the supporting board to slide along the holding arms, two extension plates perpendicularly extend away from each other from top ends of the side plates to slide along bottom surfaces of the covering arms.

* * * * *